United States Patent [19]

Kinoshita

[11] 4,163,245

[45] Jul. 31, 1979

[54] INTEGRATED CIRCUIT DEVICE

[75] Inventor: Hiroyuki Kinoshita, Tokyo, Japan

[73] Assignee: Tokyo Shibaura Electric Co., Ltd., Japan

[21] Appl. No.: 753,814

[22] Filed: Dec. 23, 1976

[30] Foreign Application Priority Data

Dec. 26, 1975 [JP] Japan .................................. 50-156621

[51] Int. Cl.² ........................................... H01L 27/02
[52] U.S. Cl. ........................................ 357/51; 357/23; 357/48
[58] Field of Search ...................... 357/23, 51, 48, 41, 357/14, 47; 340/173 R, 173 CA; 365/174, 182, 103, 186

[56] References Cited

U.S. PATENT DOCUMENTS

| 3,573,509 | 4/1971 | Crawford | 307/303 |
| 3,701,198 | 10/1972 | Glinski | 357/47 X |
| 3,703,669 | 11/1972 | London | 357/47 X |
| 3,899,793 | 8/1975 | Wakamiya et al. | 357/48 |
| 3,925,120 | 12/1975 | Saida et al. | 357/48 X |
| 3,965,481 | 6/1976 | Esser | 357/48 X |
| 4,044,373 | 8/1977 | Nomiya et al. | 357/41 |

Primary Examiner—James W. Davie
Attorney, Agent, or Firm—Finnegan, Henderson, Farabow & Garrett

[57] ABSTRACT

An integrated circuit device comprising a semiconductor substrate of one conductivity type and provided with a circuit element capable of dynamically holding electric charges and another circuit element having p-n junctions, characterized in that at least one part of that region of the substrate which surrounds the circuit element capable of holding the above-mentioned charges is formed of an absorption region having an opposite conductivity type to that of the substrate; and that said absorption region is impressed with the highest or substantially highest level of voltage among those impressed on the circuits included in the integrated circuit device, thereby enabling the absorption region to catch minority carriers injected from said another circuit element into the substrate.

6 Claims, 7 Drawing Figures

INTEGRATED CIRCUIT DEVICE

This invention relates to an integrated circuit device, particularly, to the improvement of a MOS type integrated circuit device.

Generally, a MOS type integrated circuit, hereinafter referred to as "MOS-IC," includes circuit elements utilizing stray capacitance or a condenser. For example, a MOS transistor exhibits a high insulation property having its off-time and, thus, the stray capacitance provided by the gate electrode, etc. is utilized as a condenser for the purpose of increasing the integration density of the semiconductor chip. Where a condenser is separately provided the presence of the charge caught by the condenser serves to determine the signal of "1" or "0." Typical examples of MOS-IC of this type are a dynamic type random access memory (RAM), a shift register, etc. A major problem inherent in the MOS-IC of this type is that the charge is gradually lost by the leak current through the p-n junction, etc., rendering it necessary to regenerate the information. Accordingly, the charge retention property determines the refresh interval of memory content, the minimum frequency for use, etc. and give a large influence to the efficiency in terms of use of the MOS-IC.

Let us look into the mechanism of losing the charge, first. Appended FIG. 1 shows a conventional dynamic MOC-IC. In the drawing, a portion A denotes a circuit element performing the function of retaining dynamic charges (a memory cell where the IC is RAM). It is seen that a condenser is formed by an electrode 1 and a substrate 2 of one conductivity type. A diffusion layer 1a of the opposite conductivity type is formed in contact with the electrode 1. The diffusion layer 1a is necessary for enabling the condenser to perform its function. A MOS transistor B constituting a circuit element having p-n junctions (a decoder, a sense amplifier, etc. where the IC is RAM) is provided adjacent to the condenser A. As shown in the drawing, the transistor B comprises a gate electrode 3, a drain region 4a, a drain electrode 4, a source region 5a and a source electrode 5.

When the transistor B does not operate at all or is operating in a triode region, the charge of the condenser A is gradually lost by the leak current at the p-n junction formed between the substrate 2 and the diffusion layer 1a. In this case, the charge retention time of the condenser A is about 1 to 10 seconds at room temperature. However, when the MOS transistor B operates in a pentode region, a depletion layer is presented between the drain electrode and the channel region. In this case, electric dissociation by collision takes place in the depletion layer, thereby producing an electron-hole pair and, thus, increasing the number of carriers. A part of the carriers thus increased is injected as the minority carrier into the substrate 2 and diffused through the substrate to reach the diffusion layer 1a of the condenser A, thereby neutralizing the charge retained in the condenser. Namely, the leak current of the diffusion layer 1a is increased, resulting in a rapid loss of the charge held by the condenser. In this case, the charge retention time is as short as about 1 to 100 msec. at room temperature, compared with about 1 to 10 seconds for the case where the charge is neutralized at room temperature by only the leak current at the p-n junction.

In an actual MOS-IC, a number of circuits such as decoder, a sense amplifier, a clock generator, and a logic circuit are disposed adjacent to a charge retention circuit element. In addition, the transistor constituting these circuits operates in many cases in a pentode region. It follows that a large number of minority carriers are injected into the substrate, resulting in a markedly short charge retention time of the charge retention circuit element. In an actual MOS-IC, the minority carrier injection into the substrate takes place not only in the case where the MOS transistor operates in a pentode regon but also in the cases where the p-n junction is biased in the forward direction by the noise generated by the operation of the circuit and where avalanche breakdown is locally caused by bootstrap circuit, etc.

An object of this invention is to improve the above-mentioned drawbacks inherent in the conventional MOS-IC.

An integrated circuit device according to this invention comprising a semiconductor substrate of one conductivity type and provided with a circuit element capable of dynamically holding electric charges and another circuit element having p-n junctions, characterized in that at least one part of that region of the substrate which surrounds the circuit element capable of holding the above-mentioned charge is formed of an absorption region having an opposite conductivity type to that of the substrate; and that said absorption region is impressed with "the highest or substantially highest level of voltage" among those impressed on the circuits included in the integrated circuit device, thereby enabling the absorption region to catch minority carriers injected from said another circuit element into the substrate.

"The highest or substantially highest level of voltage" implies that the potential difference (absolute value) between the substrate and the absorption region is largest or slightly smaller than the largest potential difference between the substrate and any other circuit element. Namely, the term "the highest or substantially highest level of voltage," as used herein, is defined to mean the voltage level, which, when impressed on the absorption region, enables the absorption region to catch minority carriers injected from said another circuit element into the substrate. Said another circuit element having p-n junctions is preferably a MOS transistor.

This invention can be more fully understood from the following detailed description when taken in conjunction with the accompanying drawing, in which.

Figure 2A:
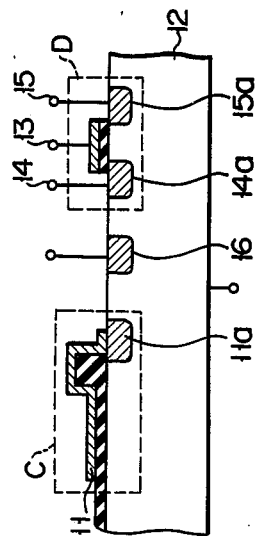
FIG. 2A is a cross sectional view of a dynamic MOS-IC according to one embodiment of this invention.
Figure 2B:
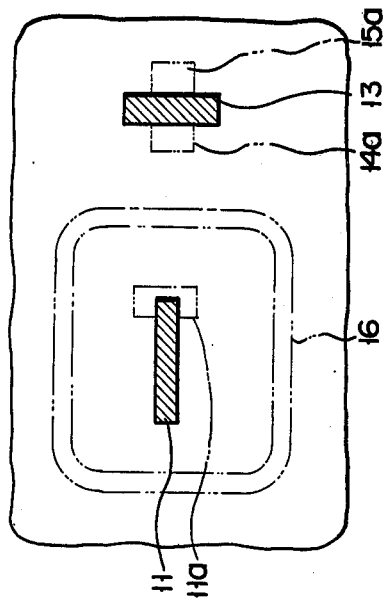
FIG. 2B is a plan view of FIG. 2A.

FIGS. 2A and 2B collectively show a MOS-IC according to one embodiment of this invention. A portion C denotes a charge retention circuit element (a memory cell where the IC is RAM), i.e., a condenser formed by an electrode 11 and a substrate 12 of one conductivity type. A diffusion layer 11a of the opposite conductivity type is formed in contact with the electrode 11 in order to enable the circuit to perform its proper function. A MOS transistor D constituting another circuit having p-n junctions (a decoder, sense amplifier, etc. where the IC is RAM) is formed adjacent to the condenser C. It is seen that the MOS transistor D comprises a gate electrode 13, a drain region 14a, a drain electrode 14, a source region 15a and a source electrode 15.

Figure 1:
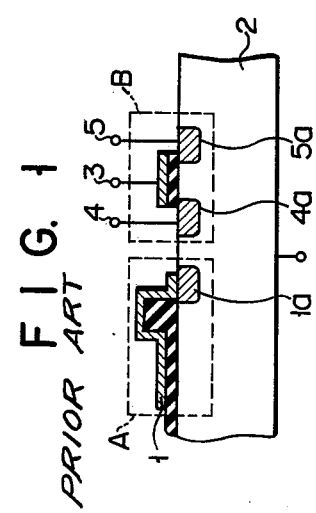
FIG. 1 is a cross sectional view of a conventional dynamic MOS-IC.

At least one part of that region of the substrate which surrounds the charge retention circuit C is formed of an absorption region 16 of the opposite conductivity type. Said absorption region is impressed with the highest or substantially highest level of voltage among those impressed on the circuits included in the IC device. In some cases, said highest or substantially highest level of voltage can well serve the purpose voltage level among those impressed on the circuits included in the IC device. The region 16 may be formed by directly diffusing an impurity or by the diffusion using a doped oxide. Further, an ion implantation method may be adopted for forming the absorption region 16. The shape (size, width and depth) and impurity concentration of the region 16 may be appropriately determined based on the voltages applied to this region and to the integrated circuit device, etc. In the embodiment of FIG. 2, the depth of the absorption region 16 is nearly equal to that of the other regions formed in the substrate, i.e., the diffusion layer 11a, the drain region 14a and the source region 15a. A majority of the minority carriers generated in the MOS transistor D and injected into the substrate enters the depletion layer of the absorption region 16 and caught by the accelerating electric field present in the depletion layer of the absorption region 16. Accordingly, the minority carriers scarcely reach the condenser C. It follows that the loss of the charge is caused by solely the leak current at the p-n junction between the substrate 12 and the diffusion layer 11a, resulting in a prominent improvement in the charge retention time of the condenser C. For example, the charge retention time of the IC according to this invention (FIG. 2) was more than 1 sec. in contrast to 10 msec. for the conventional IC shown in FIG. 1.

Figure 3:
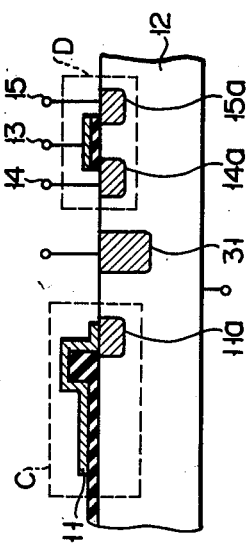
FIGS. 3 and 4 are cross sectional views each showing an integrated circuit according to another embodiment of this invention.
Figure 4:
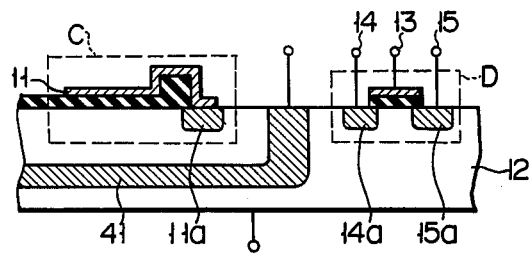

The effect of this invention is further improved by forming the absorption region as shown in FIG. 3 or 4. Specifically, an absorption region 31 in FIG. 3 is formed deeper than the diffusion layer 11a, the drain region 14a and the source region 15a. The absorption region 31 may be formed by adopting together a double diffusion method and an electro-chemical method. In FIG. 4, an absorption region 41 is formed to surround entirely the diffusion region 11a. Incidentally, the reference numerals and symbols shown in FIGS. 3 and 4, which are the same as those of FIG. 2, denote the same members.

An additional merit of this invention is that a desired integrated circuit can be produced by an ordinary method without charging or increasing the manufacturing steps.

Figure 5:
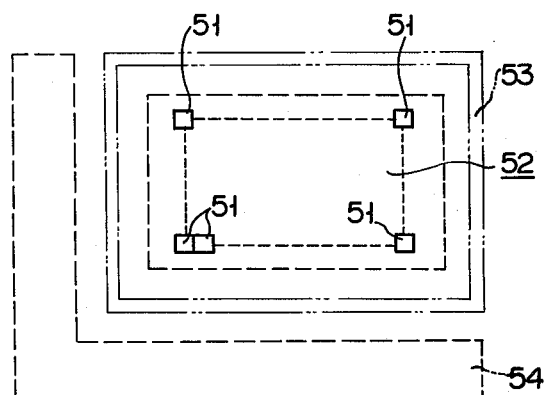
FIG. 5 is a plan view showing a RAM of high integration density according to another embodiment of this invention.
Figure 6:
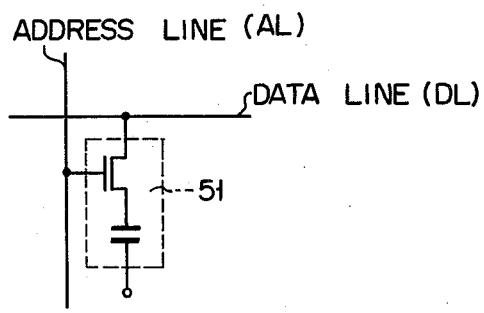
FIG. 6 shows the circuit of the memory cell of FIG. 5.

FIG. 5 shows a preferred embodiment of this invention for the case where the integrated circuit constitutes a RAM. Unlike the embodiment of FIG. 2 where the memory cell C is surrounded by the absorption region 16, a plurality of memory cells 51 constituting a single cell array 52 are surrounded by an absorption region 53 in the embodiment of FIG. 5. Further, outer circuit 54 such as a clock generator and a sense amplifier is provided outside of the absorption region 53. Accordingly, the minority carriers injected from the outer circuit 54 into the substrate are caught by the absorption region 53. It follows that the particular construction shown in FIG. 5 permits markedly improving the integration density of the integrated circuit with little influence given to the memory cell 51 in terms of its charge retention capability. The RAM as shown in FIG. 5 produces a particularly prominent effect where the memory cell 51 is of one transistor/cell type as shown in FIG. 6 and the voltage of data line (DL) oscillates between $(V_{DD}-V_{TH})$ and $V_{SS}$, with the voltage of address line (AL) oscillating between $V_{DD}$ and $V_{SS}$. Incidentally, $V_{DD}$, $V_{TH}$ and $V_{SS}$ denote power source voltage, threshold voltage and reference voltage, respectively.

What is claimed is:

1. An integrated circuit device comprising at least one capacitive circuit element, at least one MOS active circuit element having at least one p-n junction, both elements being formed on a semiconductor substrate of one conductivity type and a carrier absorption region of an opposite conductivity type to that of said semiconductor substrate formed in said semiconductor substrate between said capacitive element and said MOS active element, said absorption region being impressed with the highest absolute level of voltage among those impressed on said circuit elements included in said integrated circuit device to catch minority carriers injected from said MOS active circuit element into said semiconductor substrate.

2. An integrated circuit device according to claim 1, wherein said absorption region surrounds entirely said capacitive circuit element.

3. An integrated circuit device according to claim 1, wherein said circuit elements comprise regions of said opposite conductivity type and said absorption region has a depth substantially equal to that of said regions constituting said circuit elements.

4. An integrated circuit device according to claim 3 wherein said absorption region surrounds entirely said capacitive circuit element.

5. An integrated circuit device according to claim 1, wherein said circuit elements comprise regions of said opposite conductivity type and said absorption region has a depth larger than the depths of said regions constituting said circuit elements.

6. An integrated circuit device according to claim 5, wherein said absorption region surrounds entirely said capacitance circuit element.

* * * * *